(12) United States Patent
Pan

(10) Patent No.: US 8,362,921 B2
(45) Date of Patent: Jan. 29, 2013

(54) VEHICLE EXTERNAL WARNING SOUND GENERATION SYSTEM AND METHOD

(75) Inventor: Davis Y. Pan, Arlington, MA (US)

(73) Assignee: Bose Corporation, Framingham, MA (US)

( * ) Notice: Subject to any disclaimer, the term of this patent is extended or adjusted under 35 U.S.C. 154(b) by 316 days.

(21) Appl. No.: 12/882,249

(22) Filed: Sep. 15, 2010

(65) Prior Publication Data

US 2012/0062391 A1 Mar. 15, 2012

(51) Int. Cl.
*G08G 1/00* (2006.01)
*G08B 3/00* (2006.01)
*H03G 3/20* (2006.01)

(52) U.S. Cl. .................. 340/901; 340/384.1; 340/384.4; 340/692; 381/57; 381/58; 381/86; 367/199

(58) Field of Classification Search .................. 340/901, 340/384.1, 384.4; 381/57, 86
See application file for complete search history.

(56) References Cited

U.S. PATENT DOCUMENTS

| 5,615,270 | A | 3/1997 | Miller et al. |
| 5,635,903 | A | 6/1997 | Koike et al. |
| 7,092,536 | B1 * | 8/2006 | Hutt et al. ........................ 381/96 |
| 7,606,376 | B2 * | 10/2009 | Eid et al. ........................ 381/86 |

FOREIGN PATENT DOCUMENTS

| EP | 1 530 400 A1 | 5/2005 |
| GB | 2 211 685 A | 7/1989 |

OTHER PUBLICATIONS

International Search Report issued in corresponding PCT Application No. PCT/US2011/051283 mailed Jan. 19, 2012.
Written Opinion of the International Searching Authority issued in corresponding PCT Application No. PCT/US2011/051283 mailed Jan. 19, 2012.

* cited by examiner

*Primary Examiner* — Donnie Crosland
(74) *Attorney, Agent, or Firm* — Brian M. Dingman; Mirick, O'Connell, DeMallie + Lougee, LLP

(57) ABSTRACT

A vehicle external warning sound generation system and method. A transducer generates warning sounds external to the vehicle in response to an input sound signal. A sensor senses sound external to the vehicle and has an output signal that represents both sensed ambient noise and sensed warning sounds. A processing system, responsive to the sensor output signal, generates the sound signal that is provided to the transducer. The processing system includes an adaptive filter which reduces the level of the warning sounds in the sensor output signal, so that mostly ambient noise remains.

23 Claims, 2 Drawing Sheets

VEHICLE EXTERNAL WARNING SOUND GENERATION SYSTEM AND METHOD

FIELD

This disclosure relates to a vehicle external warning sound generation system and method.

BACKGROUND

Pedestrian warning systems for hybrid and electric vehicles and other vehicles that run more quietly than those with internal combustion engines typically generate a predetermined warning signal and play it from one or more external speakers. The warning sounds should only be as loud as necessary to serve as a pedestrian warning, and heard only by people outside and in the path of the vehicle. Some such systems adjust the warning sound output level based on the background ambient noise level. However, a human's perception of sound in the presence of noise depends on the frequency and level of the noise. Accordingly, the perceived volume of pedestrian warning sounds may be insufficient in certain circumstances or may be too loud in other circumstances.

SUMMARY

In general, one aspect of the invention features a vehicle external warning sound generation system. The system has a transducer that generates warning sounds external to the vehicle in response to an input sound signal, a sensor that senses sound external to the vehicle and has an output signal that represents both sensed ambient noise and sensed warning sounds emitted by the vehicle, and a processing system, responsive to the sensor output signal, that generates the sound signal that is provided to the transducer. The processing system includes an adaptive filter which reduces the level of the vehicle's sensed warning sounds in the sensor output signal, so that mostly ambient noise remains in the sensor output signal. The sensor may be a microphone. The transducer may be a loudspeaker. The processing system may include a digital signal processor. The processing system may also include a variable gain element, and a volume control with dynamic equalization.

Various implementations of the invention may include one or more of the following features. The adaptive filter may determine the transfer function from the transducer generating the warning sounds to the sensor output signal. The processing system may model the warning sound signal within the sensor output signal and remove the modeled warning sound signal, to leave an ambient noise signal. One or more properties of the generated warning sounds may be related to the ambient noise signal. The properties may include the volume, such that the generated warning sounds are audible over the ambient noise. The properties may include the frequency, such that the frequency of the generated warning sound is related to the ambient noise. The generated warning sounds may be divided into a plurality of frequency bands, and the gain in each band may be adjusted based on the ambient noise level in that band. The processing system may further include an equalizer that alters the volume of one or more frequency bands of the generated warning sound signal.

Various additional implementations of the invention may include one or more of the following features. The generated warning sounds may have a particular frequency or frequency range, and the system may further include a filter for the sensor output signal that removes contribution to the sensor output signal from sensed frequencies that are outside the particular auditory masking frequency or frequency range of the warning sounds. The processing system may be further responsive to the vehicle speed such that one or more properties of the warning sounds is related to the vehicle speed. The properties may include the volume and pitch of the warning sounds. The system may further include a second sensor that senses the roughness of the surface on which the vehicle is traveling. The processing system may be responsive to the second sensor such that the volume of the generated warning sounds is indirectly related to the sensed roughness.

In general, in another aspect the invention features a vehicle external warning sound generation system including a transducer that generates warning sounds external to the vehicle in response to an input sound signal, a first sensor that senses sound external to the vehicle and has an output signal that represents both sensed ambient noise and sensed warning sounds, a second sensor that senses the roughness of the surface on which the vehicle is traveling, and a third sensor that senses the speed of the vehicle. There is a processing system, responsive to the first, second and third sensors, that generates the input sound signal that is provided to the transducer. The processing system includes an adaptive filter which reduces the level of the vehicle's sensed warning sounds in the sensor output signal, so that mostly ambient noise remains in the sensor output signal. The adaptive filter determines the transfer function from the transducer generating the warning sounds to the sensor output signal. The processing system models the warning sound signal within the sensor output signal and removes the modeled warning sound signal to leave an ambient noise signal. The processing system is further responsive to the second sensor such that the volume of the warning sounds is indirectly related to the sensed surface roughness. The processing system is still further responsive to the third sensor such that one or both of the volume and pitch of the generated warning sounds is related to the vehicle speed. One or both of the volume and pitch of the generated warning sounds are also related to the ambient noise, such that the generated warning sounds are audible over the ambient noise and the frequency-dependent gain of the warning sound is related to the ambient noise.

In general, in another aspect the invention features a method of modulating vehicle external warning sounds using a system that comprises a transducer that generates warning sounds external to the vehicle, and a sensor that senses sound external to the vehicle and has an output signal that represents both sensed ambient noise and sensed warning sounds emitted by the vehicle, and a processing system. The sensor output signal is provided to the processing system. The processing system is used to generate the sound signal that is provided to the transducer to cause the transducer to generate the warning sounds. The processing system includes an adaptive filter which reduces the level of the vehicle's sensed warning sounds in the sensor output signal, so that mostly ambient noise remains in the sensor output signal.

Various additional implementations of the invention may include one or more of the following features. The adaptive filter may determine the transfer function from the warning sound transducer to the sensor output signal. The processing system may model the warning sound signal within the sensor output signal and remove the modeled warning sound signal, to leave an ambient noise signal. One or more properties of the generated warning sounds may be related to the ambient noise signal.

Various additional implementations of the invention may include one or more of the following features. The properties of the generated warning sounds may include the volume, such that the warning sounds are audible over the ambient noise, and the frequency, such that the frequency of the warning sound is related to the ambient noise. The generated warning sounds may be divided into a plurality of frequency bands, and the gain in each band may be adjusted based on the ambient noise level in that band. The processing system may be further responsive to the vehicle speed such that at least one of the volume and pitch of the generated warning sounds is related to the vehicle speed. Also, there may be a second sensor that senses the roughness of the surface on which the vehicle is traveling, and the processing system may be further responsive to the second sensor such that the volume of the generated warning sounds is indirectly related to the sensed roughness.

DETAILED DESCRIPTION

This disclosure is related to a vehicle external warning sound generation system and method. One or more transducers are used to generate warning sounds external to the vehicle. The warning sounds can be similar to the sound made by an internal combustion engine, or can be more artificial. Typically the warning sounds are at multiple frequencies and/or have a variable frequency. One or more sensors are used to sense sound external to the vehicle. These sensors have output signals that represent the sensed ambient noise as well as the sensed warning sounds from the vehicle. A processing system is responsive to the sound sensors. The processing system generates a sound signal that is provided to the transducers to produce the warning sounds. The processing system includes an adaptive filter which reduces the level of the warning sounds sensed by the sound sensors so that mostly ambient noise remains. As a result, one or more properties of the warning sounds such as volume and/or tone can be properly adjusted relative to the ambient noise such that the perceived volume or tone of the warning sounds is both sufficient and appropriate relative to the ambient noise.

Figure 1:
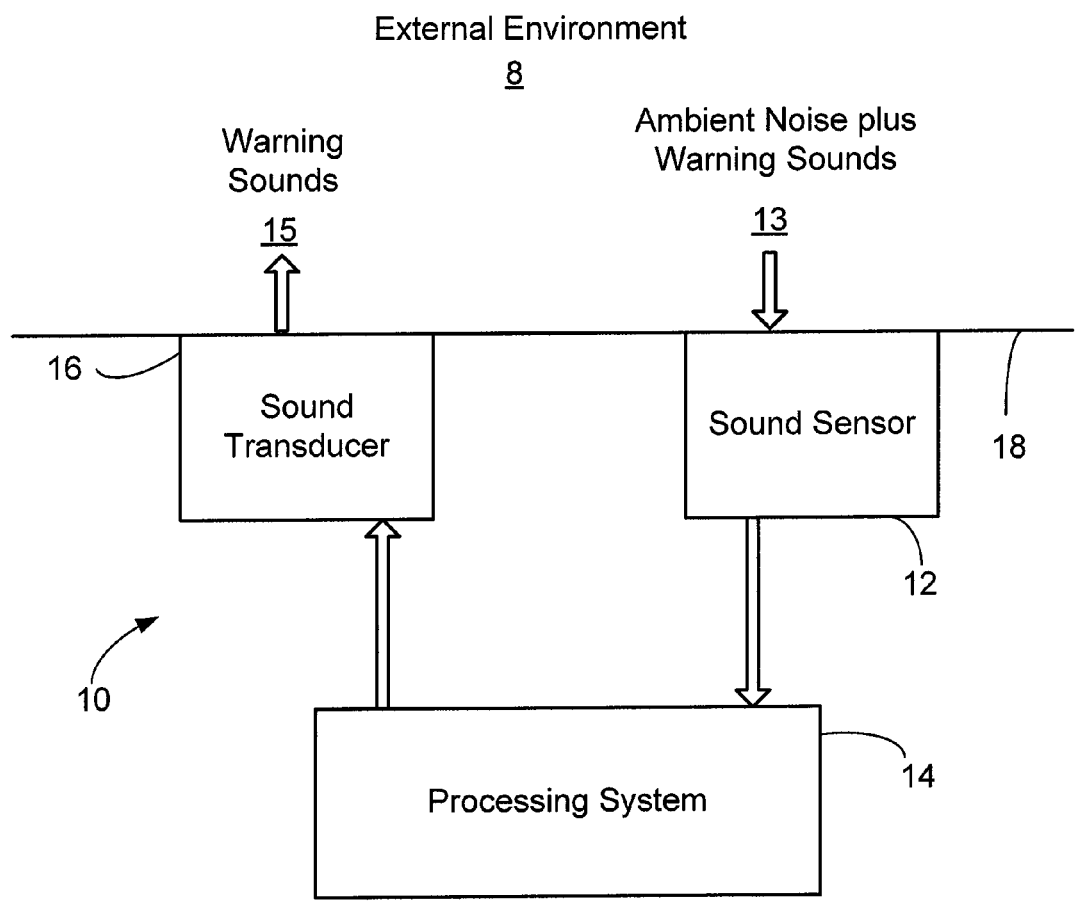
FIG. 1 is a simplified schematic block diagram of a vehicle external warning sound generation system that can also be used for a method of modulating vehicle external warning sounds.

System 10, FIG. 1, includes sound sensor 12 exposed to the external environment 8 of a vehicle 18. Sensor 12 receives sound 13 that is present at its location. This sound 13 includes both ambient noise as well as the vehicle's own warning sounds in external environment 8. Sound sensor 12 may be a microphone, for example. Sensor 12 generates an output signal that represents both sensed ambient noise and sensed warning sounds. This signal is provided to processing system 14.

Sound transducer 16 is mounted such that the sound it generates is projected from vehicle 18 into external environment 8. It is desirable to generate warning sounds 15 that are sufficient to be perceived by pedestrians and others in the path of the vehicle without being too loud. Also, the warning sounds can be responsive to the frequencies of the ambient noise such that any masking effect of particular ambient noise frequencies is appropriately overcome; this allows warning sounds at those frequencies to be properly perceived by those in the vicinity of the vehicle.

Processing system 14 comprises an adaptive filter that determines the transfer function from the input of sound transducer 16 to the output of sound sensor 12. The adaptive filter models the vehicle's own warning sound signal (as opposed to warning sounds from other vehicles) within the sound sensor signal so that the warning sound signal can be removed, to leave the ambient noise signal. The remaining ambient noise signal is used to determine one or more properties of the warning sound signal that is output from processing system 14 to sound transducer 16 that results in the warning sounds. One property is volume. Another property is pitch or frequency. The volume can be varied for all frequencies of the warning sound, or for particular frequencies only, or for one or more particular frequency ranges or bands. Variation relative to frequency can be used in one example to overcome a masking effect of ambient noise at such frequency or frequencies or frequency band or bands.

Figure 2:
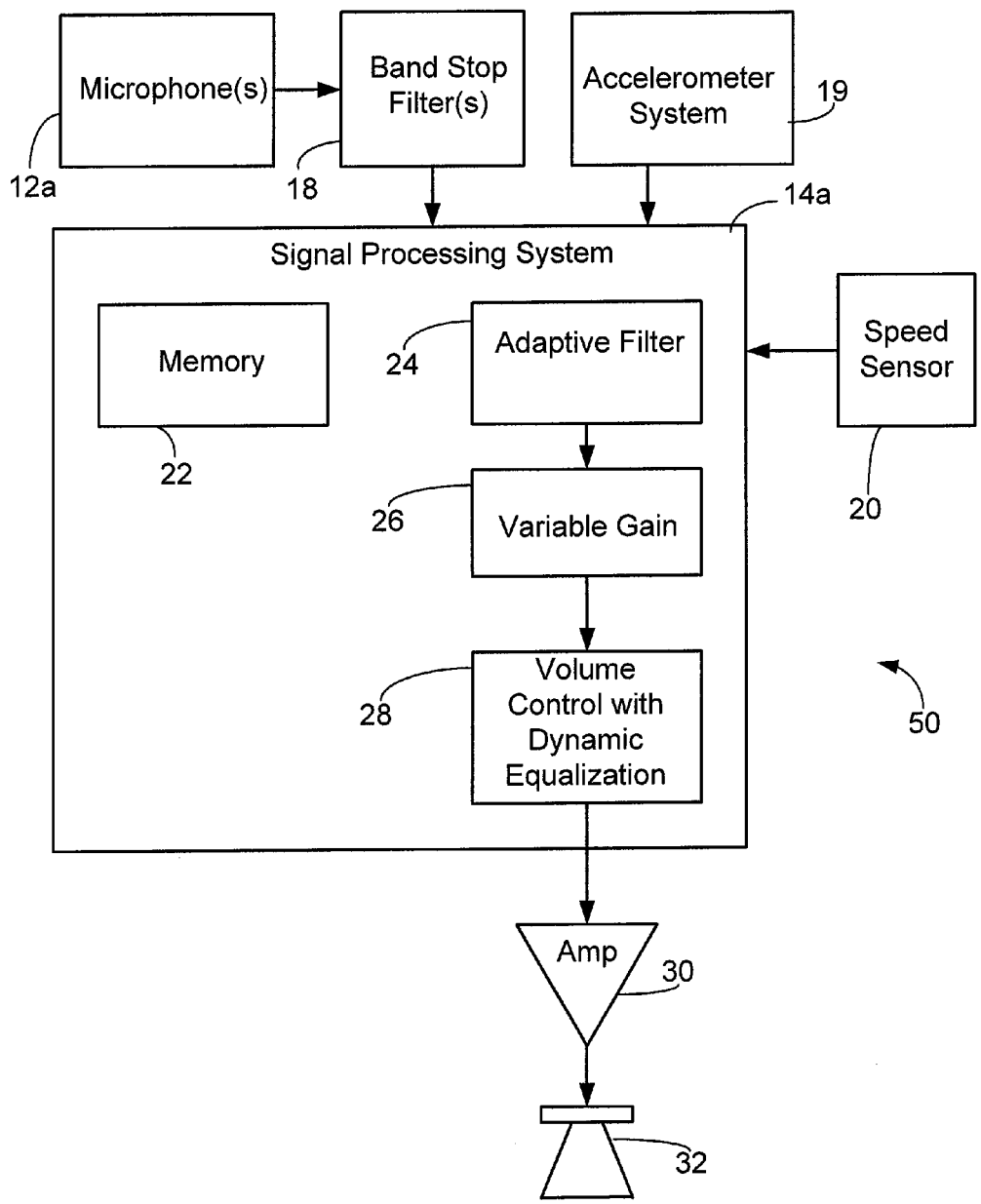
FIG. 2 is a more detailed schematic block diagram of a vehicle external warning sound generation system that can also be used for a method of modulating vehicle external warning sounds.

System 50, FIG. 2, includes an adaptive filter and also accomplishes dynamic equalization of the warning sounds. Microphone or microphones 12*a* capture sounds external to the vehicle. These sounds include both ambient noise and warning sounds generated by transducer or transducers 32. One or more optional band stop filters 18 (or other types of filters, to achieve a desired result) can be used to filter the frequency, frequency range or more than one frequency range of the warning sounds from the sensed signals as a means to reduce the contribution of sensed warning sounds. In one optional application, band pass filters are used in addition to the adaptive filter, to limit the frequency range to span only the range which may cause auditory masking of the band-limited warning sounds.

System 50 can optionally further include one or more accelerometers making up accelerometer system 19. These accelerometers are used to detect vehicle accelerations caused by road surface irregularities or bumpiness. Signal processing system 14*a* can accept these accelerometer signals so that the warning sounds can be controlled relative to the sensed bumpiness. In one example, when the surface is sufficiently rough such that the motion of the vehicle itself over the rough surface generates sufficient noise to warn pedestrians of the presence of the vehicle, signal processing system 14*a* can inhibit warning sounds played over speaker 32. Additionally, one or more properties of the warning sounds may be altered dependent on the sensed accelerations. For example, as bumpiness increases a vehicle will naturally generate more sound simply by the motions caused by the bumpiness. As bumpiness increases or speed over a bumpy surface increases, the generated noise volume will increase and its frequencies may change. System 14*a* can take these factors into account and appropriately modify the warning sounds. For example, the volume of the warning sounds can progressively decrease as bumpiness progressively increases such that the combination of the noise generated due to the bumpiness and the warning sounds is sufficient to act as a pedestrian warning.

Speed sensor 20 is also optional, and can be used in addition to or in place of accelerometer system 19. Speed sensor 20 provides the vehicle speed as an input to system 14*a*. Sensor 20 allows system 14*a* to control the volume and/or pitch of the warning sounds in relation to the speed of the vehicle. Similar to the operation using accelerometer system 19, operation using speed sensor 20 can result in a combination of sound naturally generated by the vehicle as it moves at a particular speed and the generated warning sounds that is sufficient to warn pedestrians and others of the presence of the vehicle. For example, as the speed increases the volume of the generated warning sounds can be decreased. At a particular speed (at which the vehicle itself generates sufficient noise), the generation of warning sounds that are projected from speaker 32 can cease.

When both accelerometer system 19 and speed sensor 20 are used, system 14a can take into account noise naturally generated by the vehicle motion due to the speed and the surface irregularities. These sensors can help the system differentiate between desired noise (e.g., tire, road and wind noise) which can substitute for the warning sound and environmental noise which does not come from the vehicle and may mask the warning sound. The relationship of the generated warning sounds to the bumpiness and/or the speed may be determined in advance and system 14a may be enabled to react accordingly. For example, a lookup table (e.g., resident in memory 22) or other means of determining the proper warning sounds, the warning sound volume and/or tone relative to particular accelerations and/or sensed speeds can be used. System 14a would extract the appropriate control values from the lookup table based on the input speed and/or accelerations.

System 14a comprises any necessary memory 22. System 14a further comprises adaptive filter 24. Adaptive filters used in dynamic sound optimization are known in the art, for example as disclosed in U.S. Pat. No. 5,615,270 which is incorporated herein by reference. System 14a may also optionally include a variable gain element 26. Element 26 may be a variable gain amplifier. Element 26 may have its gain controlled by the accelerometer signal and/or the speed signal to adjust the level of the warning sounds based on one or both of these variables. The system may divide the warning sounds into two or more bands, and the gain in each band may be adjusted independently of the other based on the noise level in that band. Volume control with dynamic equalization 28 may optionally be included to alter the equalization of the warning sounds at one or more particular frequencies or frequency ranges. For example, warning sounds in the bass frequency region or band (typically below about 200 Hz) are typically masked by bass-dominant ambient noise to a greater extent than higher frequency warning sounds are masked by higher frequency noise. Accordingly, the volume of warning sounds at one or more frequencies or frequency ranges can be increased (via increased gain) relative to the volume of warning sounds at one or more other frequencies or frequency ranges, so that the perceived sound volume of the warning sounds relative to the ambient noise is sufficient and appropriate at all frequencies.

Signal processing system 14a may be accomplished with a digital signal processor such as the ADSP-2365 SHARC® Processor from Analog Devices of Norwood, Mass., to name one example. Necessary A/D and D/A converters and other ancillary components are not shown in the drawing as such are known in the art. The output of system 14a is provided to power amplifier 30 which then provides the warning sound signals to transducer or transducers 32.

The described systems also accomplish methods of modulating vehicle external warning sounds. These methods are accomplishing by providing a processing system such as the systems described hereinabove. The output signal of one or more sensors that sense sound external to the vehicle are provided as inputs to the processing system. These signals include a component due to ambient noise and a component due to vehicle-generated warning sounds. As described above, the warning sound signals are reduced or removed using an adaptive filter, to leave a noise signal that entirely or primarily results from the ambient noise. The processing system uses this noise signal to control the gain and/or equalization of the sound signal that is provided to the transducer to cause the transducer to generate the warning sounds.

Other implementations are within the scope of the following claims.

The invention claimed is:

1. A vehicle external warning sound generation system, comprising:
a transducer that generates warning sounds external to the vehicle in response to an input sound signal;
a sensor that senses sound external to the vehicle and has an output signal that represents both sensed ambient noise and sensed warning sounds emitted by the vehicle; and
a processing system, responsive to the sensor output signal, that generates the input sound signal that is provided to the transducer, wherein the processing system comprises an adaptive filter which reduces a level of the vehicle's sensed warning sounds in the sensor output signal, so that mostly ambient noise remains in the sensor output signal.

2. The system of claim 1 wherein the adaptive filter determines a transfer function from the transducers generating the warning sounds to the sensor output signal.

3. The system of claim 2 wherein the processing system models a warning sound signal within the sensor output signal and removes the modeled warning sound signal, to leave an ambient noise signal.

4. The system of claim 3 wherein one or more properties of the generated warning sounds are related to the ambient noise signal.

5. The system of claim 4 wherein the properties comprise a volume, such that the generated warning sounds are audible over the ambient noise.

6. The system of claim 4 wherein the properties comprise a frequency, such that the frequency of the generated warning sound is related to the ambient noise.

7. The system of claim 6 wherein the generated warning sounds are divided into a plurality of frequency bands, and a gain in each band is adjusted based on the ambient noise level in that band.

8. The system of claim 6 wherein the processing system further comprises an equalizer that alters a volume of one or more frequency bands of the generated warning sound signal.

9. The system of claim 1 wherein the generated warning sounds have a particular frequency or frequency range, and the system further comprises a filter for the sensor output signal that removes contributions to the sensor output signal from sensed frequencies that are outside the particular frequency or frequency range of the warning sounds.

10. The system of claim 1 wherein the processing system is further responsive to a vehicle speed such that one or more properties of the warning sounds is related to the vehicle speed.

11. The system of claim 10 wherein the properties include a volume and a pitch of the warning sounds.

12. The system of claim 1 further comprising a second sensor that senses a roughness of the surface on which the vehicle is traveling, wherein the processing system is further responsive to the second sensor such that a volume of the generated warning sounds is indirectly related to the sensed roughness.

13. The system of claim 1 wherein the sensor comprises a microphone.

14. The system of claim 1 wherein the transducer comprises a loudspeaker.

15. The system of claim 1 wherein the processing system comprises a digital signal processor.

16. The system of claim 1 wherein the processing system further comprises a variable gain element and a volume control with dynamic equalization.

17. A vehicle external warning sound generation system, comprising:
- a transducer that generates warning sounds external to the vehicle in response to an input sound signal;
- a first sensor that senses sound external to the vehicle and has an output signal that represents both sensed ambient noise and sensed warning sounds emitted by the vehicle;
- a second sensor that senses a roughness of the surface on which the vehicle is traveling;
- a third sensor that senses a speed of the vehicle;
- a processing system, responsive to the first, second and third sensors, that generates the input sound signal that is provided to the transducer, wherein the processing system comprises an adaptive filter which reduces a level of the vehicle's sensed warning sounds in the first sensor output signal so that mostly ambient noise remains in the first sensor output signal, wherein the adaptive filter determines a transfer function from the transducer generating the warning sounds to the first sensor output signal, wherein the processing system models the warning sound signal within the first sensor output signal and removes the modeled warning sound signal to leave an ambient noise signal;
- wherein the processing system is further responsive to the second sensor such that a volume of the generated warning sounds is indirectly related to the sensed surface roughness, and the processing system is still further responsive to the third sensor such that one or both of the volume and a pitch of the generated warning sounds is related to the vehicle speed; and
- wherein one or both of the volume and pitch of the generated warning sounds are also related to the ambient noise such that the generated warning sounds are audible over the ambient noise and a frequency-dependent gain of the generated warning sound is related to the ambient noise.

18. A method of modulating vehicle external warning sounds using a system that comprises a transducer that generates warning sounds external to the vehicle, and a sensor that senses sound external to the vehicle and has an output signal that represents both sensed ambient noise and sensed warning sounds emitted by the vehicle, the method comprising:
- providing a processing system;
- providing the sensor output signal to the processing system; and
- using the processing system to generate the sound signal that is provided to the transducer to cause the transducer to generate the warning sounds, wherein the processing system comprises an adaptive filter which reduces a level of the vehicle's sensed warning sounds in the sensor output signal, so that mostly ambient noise remains in the sensor output signal.

19. The method of claim 18 wherein the adaptive filter determines a transfer function from the transducer generating the warning sounds to the sensor output signal, wherein the processing system models a warning sound signal within the sensor output signal and removes the modeled warning sound signal to leave an ambient noise signal, and wherein one or more properties of the warning sounds are related to the ambient noise signal.

20. The method of claim 19 wherein the properties of the warning sounds comprise a volume, such that the warning sounds are audible over the ambient noise, and a frequency, such that the frequency of the warning sound is related to the ambient noise.

21. The method of claim 20 wherein the generated warning sounds are divided into a plurality of frequency bands, and a gain in each band is adjusted based on an ambient noise level in that band.

22. The method of claim 18 wherein the processing system is further responsive to a vehicle speed such that at least one of a volume and a pitch of the generated warning sounds is related to the vehicle speed.

23. The method of claim 18 further comprising providing a second sensor that senses a roughness of the surface on which the vehicle is traveling, wherein the processing system is further responsive to the second sensor such that the volume of the generated warning sounds is indirectly related to the sensed roughness.

* * * * *